(12) United States Patent
Chidambarrao et al.

(10) Patent No.: US 7,615,418 B2
(45) Date of Patent: Nov. 10, 2009

(54) HIGH PERFORMANCE STRESS-ENHANCE MOSFET AND METHOD OF MANUFACTURE

(75) Inventors: Dureseti Chidambarrao, Weston, CT (US); Ricardo A. Donaton, Cortlandt Manor, NY (US); William K. Henson, Peekskill, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 451 days.

(21) Appl. No.: 11/380,688

(22) Filed: Apr. 28, 2006

(65) Prior Publication Data
US 2007/0254422 A1  Nov. 1, 2007

(51) Int. Cl.
*H01L 21/8232* (2006.01)
*H01L 21/335* (2006.01)

(52) U.S. Cl. .................. 438/142; 438/938; 257/213; 257/E21.615

(58) Field of Classification Search .......... 257/E29.049, 257/E21.626, E21.64, E21.618, E21.633, 257/E21.632, 213, 240, 510, E21.615, E21.619, 257/E21.4, E21.097, E21.092; 438/142, 438/147, 151, 154, 218, 197, 199, 163, 221, 438/222, 299, 300, 938
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |

(Continued)

FOREIGN PATENT DOCUMENTS

JP   64-76755   3/1989

(Continued)

OTHER PUBLICATIONS

Kern Rim, et al., "Transconductance Enhancement in Deep Submicron Strained-Si n-MOSFETs", International Electron Devices Meeting, 26, 8, 1, IEEE, Sep. 1998.

(Continued)

*Primary Examiner*—Victor Mandala
*Assistant Examiner*—Scott Stowe
(74) *Attorney, Agent, or Firm*—Joseph Abate; Greenblum & Bernstein P.L.C

(57) ABSTRACT

A semiconductor structure and method of manufacturing and more particularly a CMOS device with a stress inducing material embedded in both gates and also in the source/drain region of the PFET. The PFET region and the NFET region having a different sized gate to vary the device performance of the NFET and the PFET.

10 Claims, 10 Drawing Sheets

U.S. PATENT DOCUMENTS

| | | | |
|---|---|---|---|
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 6,696,334 B1 * | 2/2004 | Hellig et al. | 438/230 |
| 6,717,216 B1 | 4/2004 | Doris et al. | |
| 6,825,529 B2 | 11/2004 | Chidambarrao et al. | |
| 6,831,292 B2 | 12/2004 | Currie et al. | |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 7,217,608 B1 * | 5/2007 | Xiang | 438/199 |
| 7,335,929 B2 * | 2/2008 | Lin et al. | 257/192 |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0113174 A1 | 6/2004 | Chidambarrao et al. | |
| 2004/0113217 A1 | 6/2004 | Chidambarrao et al. | |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |
| 2006/0228851 A1 * | 10/2006 | Sadaka et al. | 438/221 |
| 2006/0286736 A1 * | 12/2006 | Orlowski et al. | 438/199 |

OTHER PUBLICATIONS

Kern Rim, et al., "Characteristics and Device Design of Sub-100 nm Strained Si N- and PMOSFETs." 2002 Symposium on VLSI Technology Digest of Technology Papers, IEEE, pp. 98-99.

Gregory Scott, et al., "NMOS Drive Current Reduction Caused by Transistor Layout and Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistor." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143, IEEE 1989.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors- Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Faax/Ft = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Ouyang et al., "Two-Dimensional Bandgap Engineering in a Novel Si/SiGe pMOSFET with Enhanced Device Performance and Scalability". 2000 IEEE, pp. 151-154.

* cited by examiner

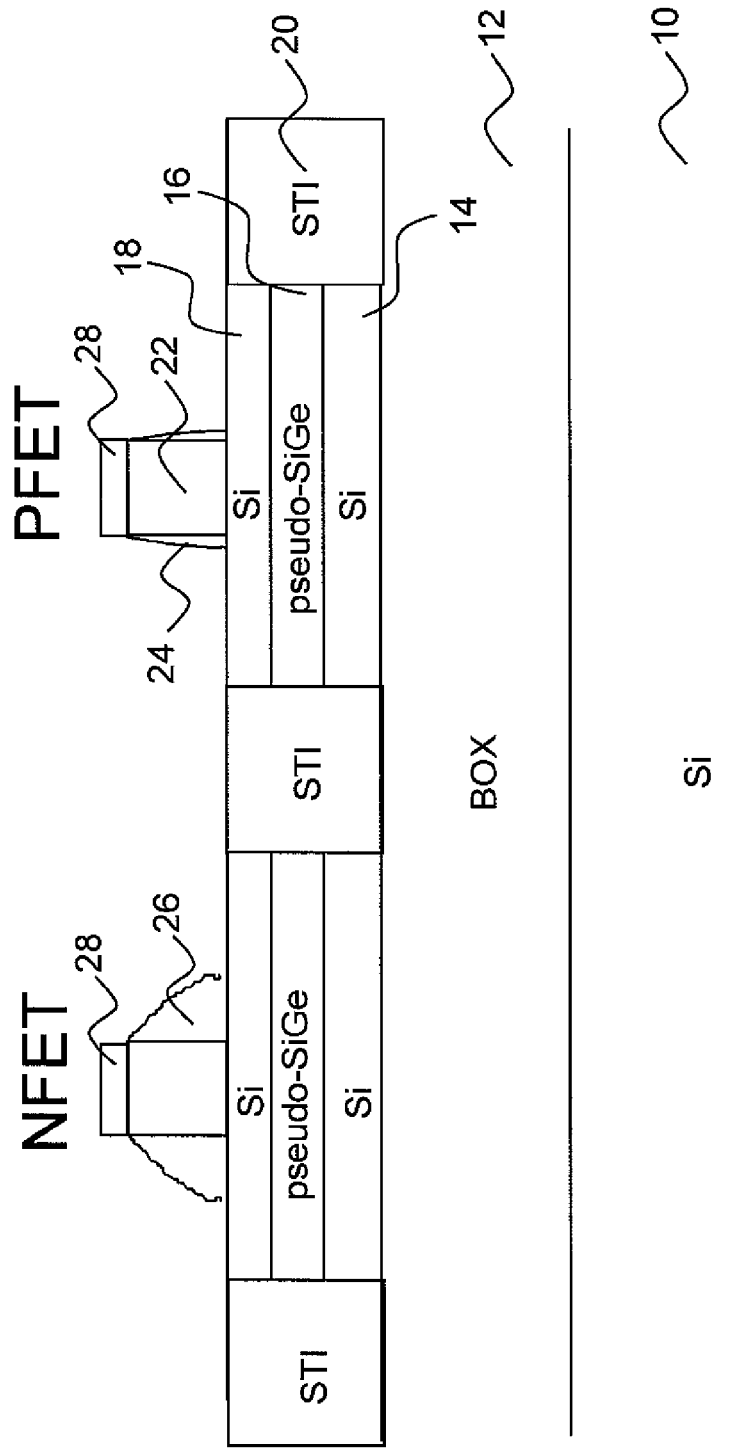

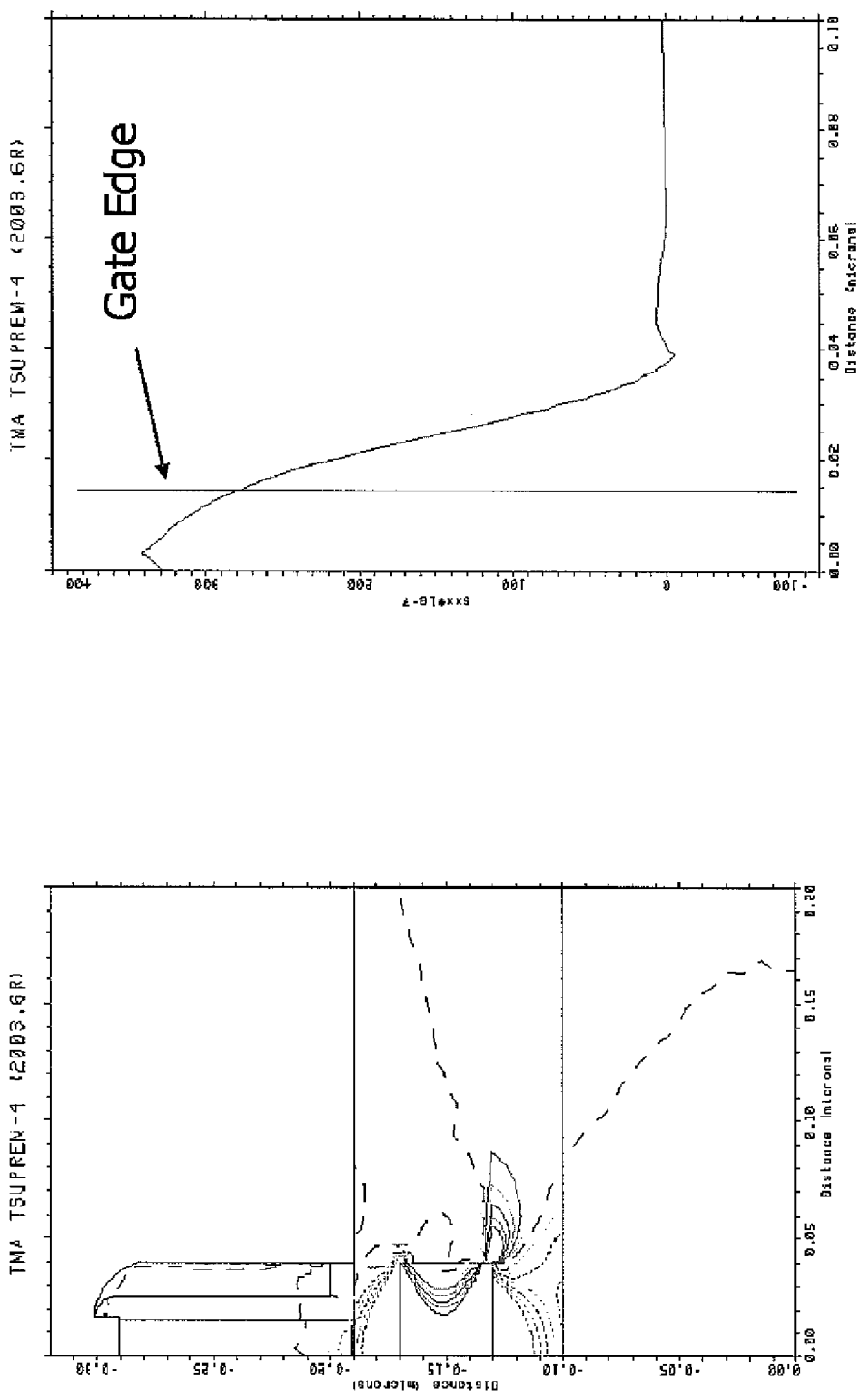

HIGH PERFORMANCE STRESS-ENHANCE MOSFET AND METHOD OF MANUFACTURE

FIELD OF THE INVENTION

The invention generally relates to a semiconductor device and method of manufacture and, more particularly, to a semiconductor device and method of manufacture which imposes tensile and compressive stresses in the device during fabrication.

BACKGROUND DESCRIPTION

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type device (e.g., NFETs) and/or p-type devices (e.g., PFETs). However, the same stress component, either tensile stress or compressive stress, discriminatively affects the characteristics of an n-type device and p-type device.

For example, it has been known that a device exhibits better performance characteristics when formed on a silicon layer (or cap) that is epitaxially grown on a SiGe layer that has relaxed on top of the silicon substrate. In this system, the silicon cap is subject to biaxial tensile strain. When epitaxially grown on silicon, an unrelaxed SiGe layer will have a lattice constant that conforms to that of the silicon substrate. Upon relaxation (through a high temperature process for example) the SiGe lattice constants approaches that of its intrinsic lattice constant which is larger than that of silicon. A fully relaxed SiGe layer has a lattice constant close to its intrinsic value. When the silicon is epitaxially grown thereon, the silicon layer conforms to the larger lattice constant of the relaxed SiGe layer and this applies physical biaxial stress (e.g., expansion) to the silicon layer being formed thereon. This physical stress applied to the silicon layer is beneficial to the devices (e.g., CMOS devices) formed thereon because the expanded silicon layer increases n-type performance while a higher Ge content in the SiGe layer improves p-type performance.

In order to maximize the performance of both NFETs and PFETs within integrated circuit (IC) chips, the stress components should be engineered and applied differently for NFETs and PFETs. That is, because the type of stress which is beneficial for the performance of an NFET is generally disadvantageous for the performance of the PFET. More particularly, when a device is in tension (e.g., in the direction of current flow in planar device), the performance characteristics of the NFET are enhanced while the performance characteristics of the PFET are diminished. To selectively create tensile stress in an NFET and compressive stress in a PFET, distinctive processes and different combinations of materials are used.

For example, a trench isolation structure has been proposed for forming the appropriate stresses in the NFETs and PFETs, respectively. When this method is used, the isolation region for the NFET device contains a first isolation material which applies a first type of mechanical stress on the NFET device in a longitudinal direction (e.g., parallel to the direction of current flow) and in a transverse direction (e.g., perpendicular to the direction of current flow). Further a first isolation region and a second isolation region are provided for the PFET and each of these isolation regions applies a unique mechanical stress on the PFET device in the transverse and longitudinal directions.

Alternatively, liners on gate sidewalls have been proposed to selectively induce the appropriate stresses in the channels of the FET devices (see, Ootsuka et al., IEDM 2000, p. 575, for example). By providing liners the appropriate stress is applied closer to the device than the stress applied as a result of the trench isolation fill technique.

While these methods do provide structures that have tensile stresses being applied to the NFET device and compressive stresses being applied along the longitudinal direction of the PFET device, they may require additional materials and/or more complex processing and thus, resulting in higher costs. Further, the level of stress that can be applied in these situations is typically moderate (i.e., on the order of 100s MPa). Therefore, it is desired to provide more cost-effective and simplified methods for creating large tensile and compressive stresses in the channels NFET and PFET, respectively.

SUMMARY OF THE INVENTION

In a first aspect of the invention, a method of manufacturing a semiconductor structure includes forming, simultaneously, a layered structure with an underlying stress inducing material, in a p-type field-effect-transistor (PFET) channel region and a n-type field-effect-transistor (NFET) channel region. The method further includes protecting the NFET channel region while forming a layer over the underlying stress inducing material of the PFET channel region to reduce the stress effect in the PFET channel region. An island is etched in the NFET channel region and the PFET channel region of different sizes, wherein the size of the island in the NFET channel region creates a higher resultant stress component than in the PFET channel region. A stress inducing material is formed in etched portions of the PFET channel region creating an opposite stress component in the PFET channel region than in the NFET channel region.

In another aspect of the invention, a method of manufacturing a semiconductor structure is provided. The method includes forming a stress-inducing layer on a substrate in an NFET region and a PFET region and forming a top layer over the stress-inducing layer in the NFET region and the PFET region. Prior to the trench etching, spacer sidewalls are placed next to the gate, which protect and cover the gate during the remainder of the manufacture process. The size of the spacers differs for the NFET and the PFET, respectively. Trenches are etched into sides of the PFET region and the NFET region.

Furthermore, in another aspect of the invention, a semiconductor structure is provided that includes a PFET and NFET channel formed in a substrate such as, for example, a Si layer. The PFET and NFET devices have a layered structure of the same materials in the channel region. Trenches are etched that result in different size of the PFET channel region and the NFET channel region, thus resulting in different stress components.

BRIEF DESCRIPTION OF THE DRAWINGS

FIGS. 1a through 1h represent a fabrication process to form a device in accordance with the invention;

FIG. 2a illustrates a location of stress in a NFET device according to the invention;

FIG. 2b shows a graph of stress as a function of longitudinal distance to the center of the gate of the NFET device in accordance with the invention.

DETAILED DESCRIPTION OF EMBODIMENTS OF THE INVENTION

This invention is directed to a semiconductor device and method of manufacture, which provides tensile stress in the NFET channel and compressive stress in the PFET channel of the CMOS. In embodiments of the invention, the stresses formed in the NFET and PFET channel can be achieved on a same substrate using similar processing steps, thus reducing the overall material costs and time for producing such device. In embodiments, channels are formed in the silicon layer in the area of the formation of the NFETs and PFETs. The channels of the devices are then separately and selectively treated such that while one channel is covered, the other channel can be etched and filled to obtain desired properties. In one implementation, sidewall spacers of a larger dimension are formed on a NFET gate than a PFET gate. Upon etching the trenches using the spacers as etching mask, the larger gate configuration imparts a larger tensile stress in the NFET region, whereas the smaller sidewall spacers in the PFET region reduce a stress component in the PFET region. By applying these techniques, tunable tensile or compressive forces can be achieved in the overlying epitaxially grown layers in the channels of the NFETs and PFETs, respectively. In one embodiment, the gate island formed after etching the source and drain trenches differ in size. This fabrication process of the invention results in devices with improved channel properties.

Figure 1A:
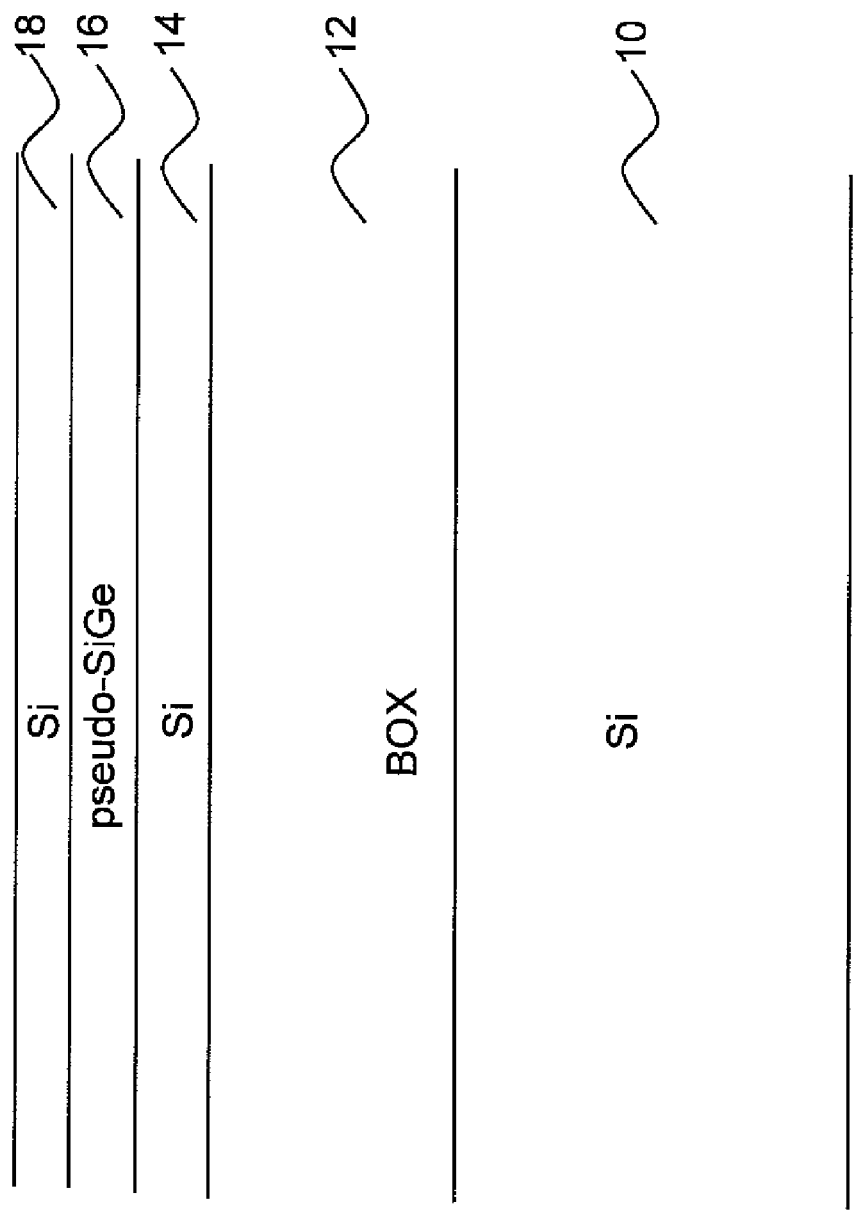

FIGS. 1a through 1h represent a fabrication process to form a device according to the invention. In FIG. 1a, a substrate including for example a silicon-on-insulator (SOI) layer 10 or the like is provided. An optional buried oxide layer (BOX) 12 may also be formed on the SOI 10 with a silicon layer 14 on the BOX 12. FIG. 1a further shows a pseudomorphic SiGe layer 16 is epitaxially grown on the silicon layer 14, followed by another epitaxial silicon layer 18.

In embodiments, the thicknesses of the layers are in various ranges including. For example, the BOX 12 may be between 1200 Å and 1600 Å, and the silicon layer 14 may be between 10 Å and 1000 Å, preferably 700 Å in thickness. Additionally, the SiGe layer 16 may be between 90 Å and 500 Å, preferably 400 Å; the Si layer 18 may be between 50 Å and 400 Å, preferably 300 Å. It should be understood, though, that the thickness of these layers can vary, depending on the various design parameters of the device.

In implementation, the pseudomorphic SiGe layer 16 is epitaxially grown in a conventional manner. The Ge content may be greater than 0% in ratio to the Si content, with a range, in embodiments, of between 20% to 30% being contemplated by the invention. The silicon layer 18 on the pseudomorphic SiGe layer 16 can be deposited in a conventional manner via any selective epitaxial silicon formation technique, for example rapid thermal chemical vapor depositions (RTCVD) or molecular beam epitaxy (MBE) may be used to epitaxially grow device quality silicon.

Figure 1B:
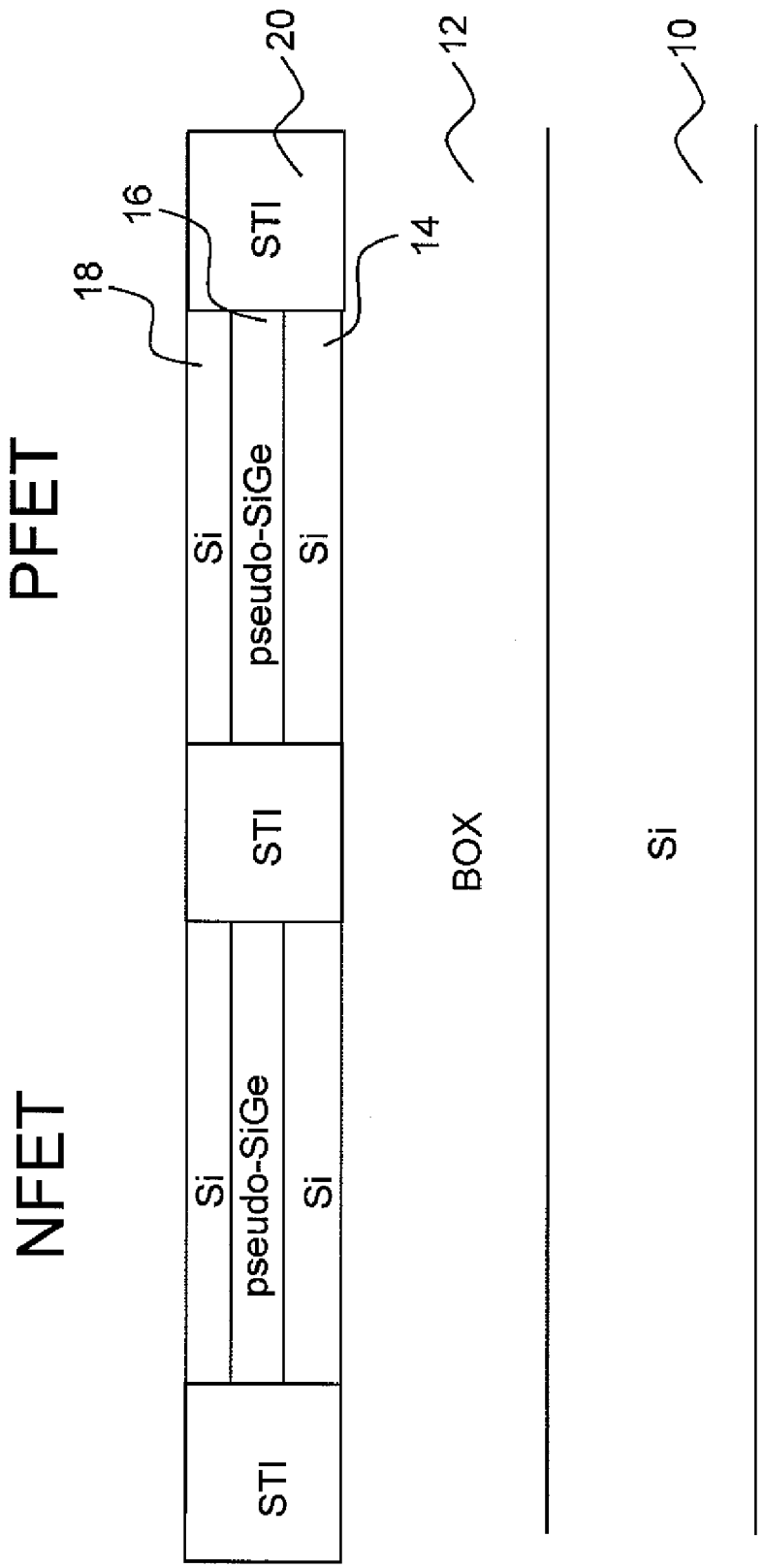

FIG. 1b shows the separated channels (or device regions) formed by shallow trench isolation (STI) 20. The insulating trenches 20 are formed by conventional patterning processes including lithography and etching steps. For example, the stacked layers 14, 16, 18 are patterned to form STIs 20 using standard techniques of pad oxidation, pad nitride deposition, lithography based patterning, reactive ion etching (RIE) of the stacked layers, to the buried oxide. A liner deposition, fill deposition, and chemical mechanical polish, for example, can then be used to form the STI 20. The STI formation process is well known in the art.

FIG. 1c depicts the preparation of the gate electrodes. Placement of a polysilicon gates 22 capped with, for example, SiN layer 28, is performed through conventional processing in both the NFET and PFET region of the device. This process includes lithography and etching steps. By way of example, a polysilicon layer capped with a SiN protection layer 28 is formed on the structure. A lithography process is applied which entails applying a photoresist on the SiN capped polysilicon layer, exposing the photoresist to a pattern of radiation, and developing the pattern utilizing a conventional resist developer. Following the lithography step, a conventional etching process such as RIE, plasma etching, ion beam etching, or laser ablation may be employed in transferring the pattern to active areas of the NFET region and PFET region to form SiN capped polysilicon gates 22.

Still referring to FIG. 1c, polysilicon gates 22 are capped with a SiN protection layer 28. Sidewalls of the gates 22 are also protected with SiN, forming spacers 24 and 26. The cap 28 and the polysilicon sidewall spacers 24 and 26 are also formed in a conventional manner. In this processing, for example, a sacrificial block material is deposited on the structure. In one embodiment, the sacrificial material is a nitride material (e.g., $Si_3N_4$), which forms the SiN elements 24, 26 and 28.

The layers 24, 26 and 28 can be formed in a conventional manner, such as by chemical vapor deposition (CVD) using a silane source. Other techniques which may be suitable for forming a nitride layer include LPCVD, and atmospheric pressure CVD (APCVD).

The size of the polysilicon gates 22 and its sidewall spacers 24 and 26, which cover the underlying layer 18 in the PFET and NFET region, respectively, ranges from 200 Å to 1300 Å. It should be understood that this is applicable for gate lengths centered around a nominal value (smallest size of the technology). For example, 400 Å is a reasonable gate length for a 65 nm technology. For purpose of device performance and analysis, the size of the gate is communicated in halfwidths. The halfwidth comprises the size covered from the center of the gate to the outer edge of the spacer. In embodiments, the halfwidth of the NFET gate is larger than the halfwidth of the PFET gate. The larger NFET gate halfwidth will result in a larger tensile stress in the NFET region due to a larger area covering the underlying SiGe material. Also, the smaller halfwidth of the PFET gate configuration results in a reduction of tensile stress which is imparted by the underlying SiGe layer. In this manner, a higher compressive stress component can be imparted on the PFET gate in subsequent processing steps.

For example, the polysilicon gates 22 range in total size about 400 Å, thus having a preferred halfwidth of 200 Å (measured from the center to the edge). For the NFET region, the spacer 26 covers a size in the range of 50 Å to 500 Å, with a preferred range from 200 Å to 300 Å. Therefore, under preferred conditions and not limiting to the invention, the halfwidth of the NFET device ranges from 400 Å to 500 Å, however other combinations of the halfwidth of gate 22 and spacer 26 are contemplated. For the PFET region, the size of spacer 24 ranges from 50 Å to 300 Å, with 100 Å being preferred; however shorter sizes of spacer 24 are contemplated. Taking the above values in consideration, the halfwidth of the PFET gate ranges from 250 Å to 350 Å. The different sizes of the spacers results in higher tensile stress in the NFET channel region and reduces the tensile stress in the PFET channel region.

FIGS. 1d through 1h show the fabrication process of the gate structures, including the source and drain (S/D) regions for the NFET and PFET channel, respectively. A hard mask 30 is placed onto the PFET region prior to the preparation of the S/D trenches in the NFET channel. The regions in the NFET adjacent to the stack formed by layers 16, 18, 28, and 26 are etched down ideally to the silicon layer 14. This etching results in an elastic relaxation of the edges of the SiGe layer, creating a tensile strain placed on the upper Si layer, by the SiGe layer.

Figure 1D:
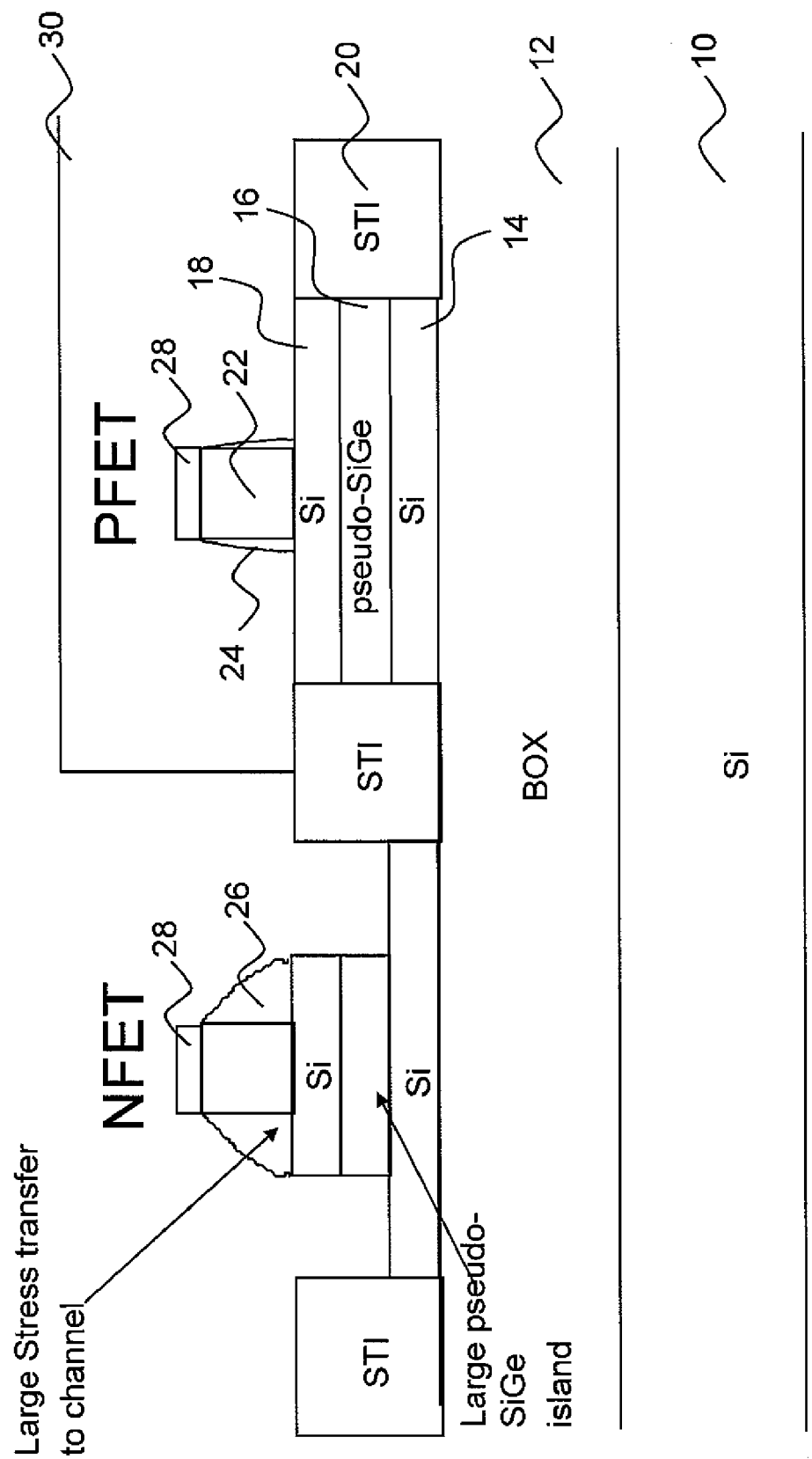
Figure 1E:
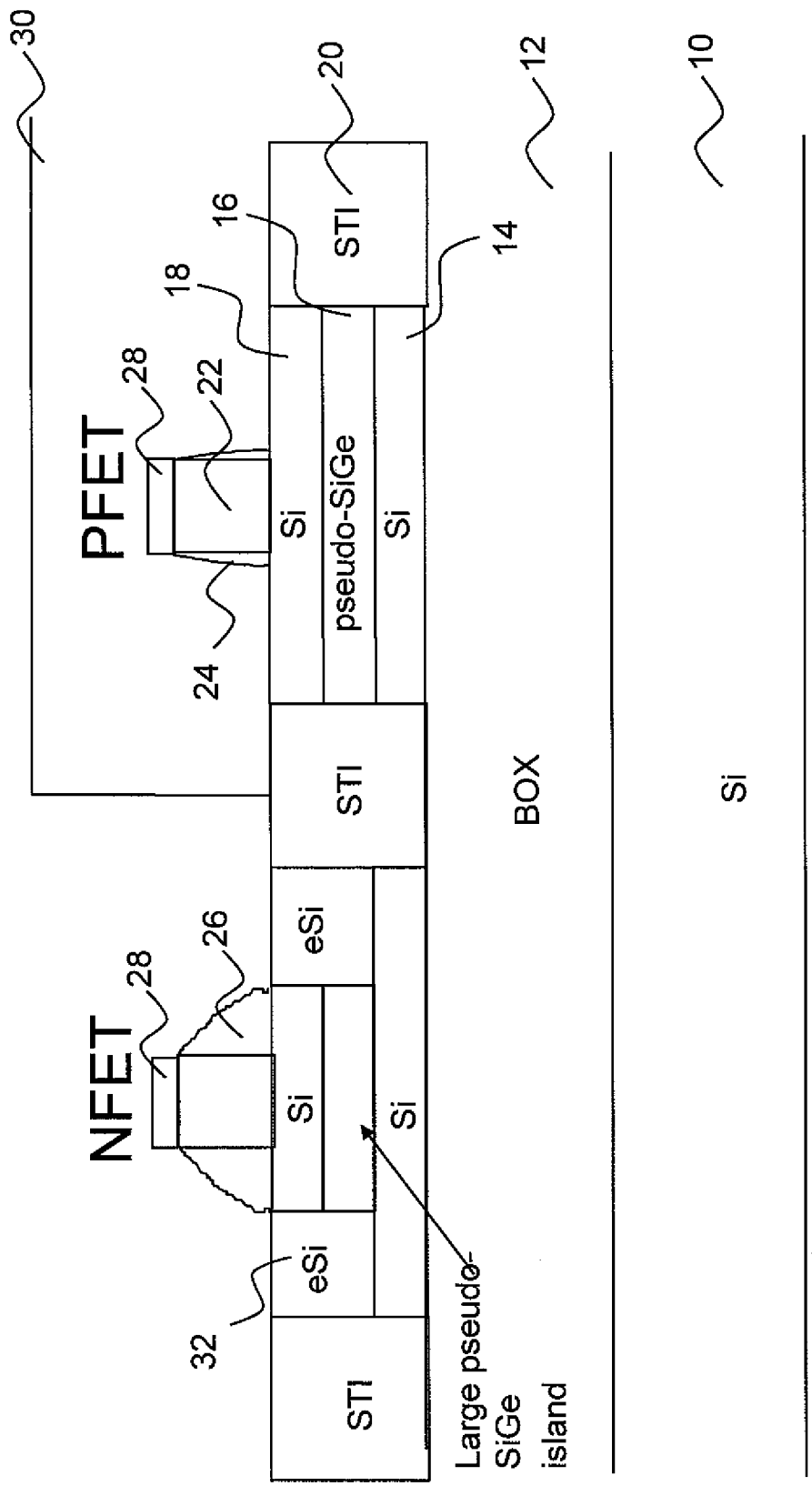

FIG. 1e depicts the device after epitaxial silicon 32 is selectively grown in the S/D trenches adjacent to the gate island formed by the SiGe and Si layers. In view of the above described dimensions, the resulting gate island results in a longitudinal size between 400 Å and 1300 Å and has a preferred halfwidth range of 400 Å to 500 Å. The pseudomorphic SiGe layer 16 within the gate island in the NFET region exercises a tensile stress onto the epitaxially grown Silicon 18 in the channel resulting in improved NFET device characteristics.

Figure 1F:
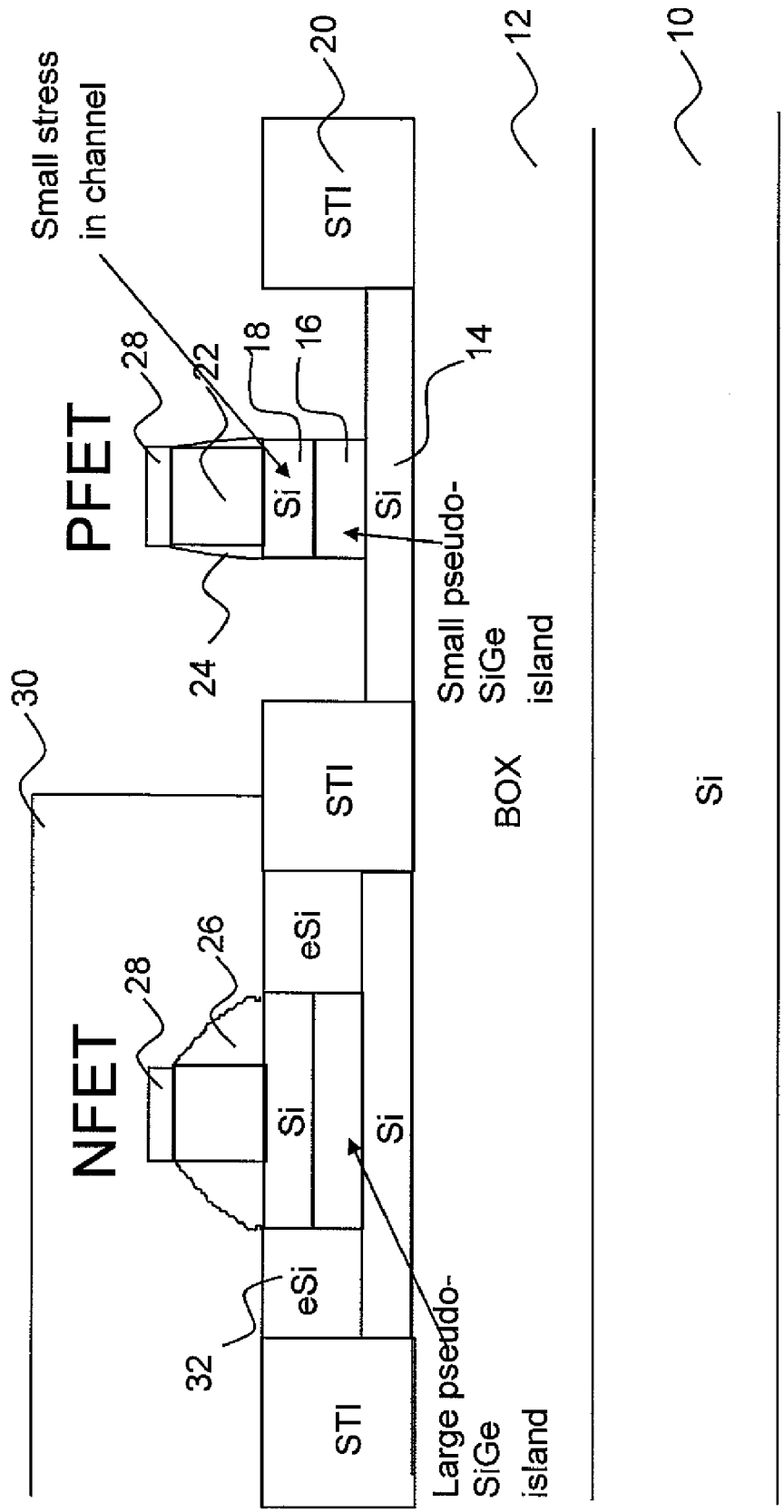

FIG. 1f—analogous to FIG. 1d—presents the S/D preparation of the PFET region. In this processing step, a protective hard mask 30 is placed over the NFET region and the S/D trenches adjacent to the stack formed by layers 16, 18, 22, 24, and 28 are etched down ideally to Si layer 14.

Figure 1G:
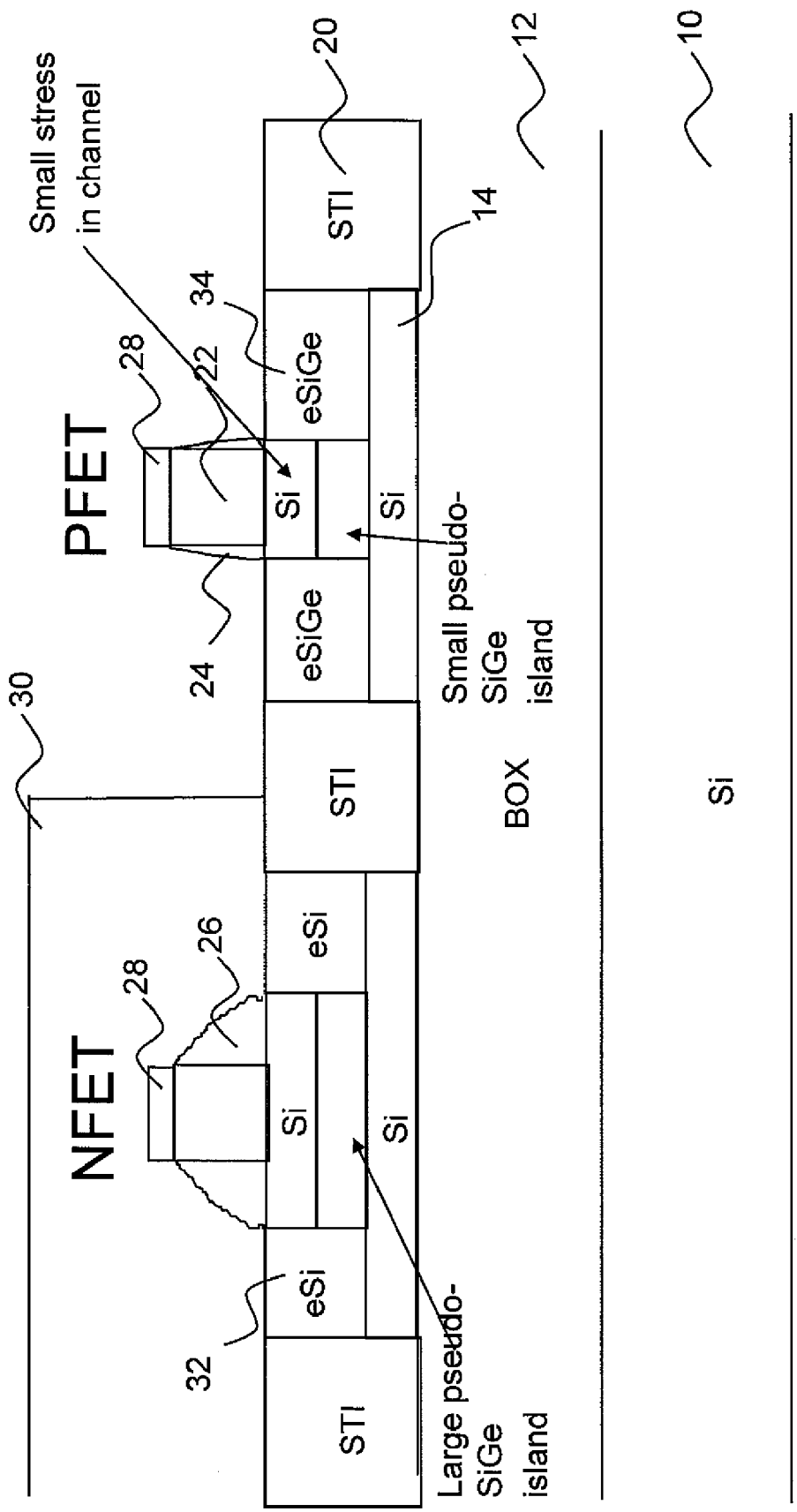

FIG. 1g depicts the filled S/D trenches of the PFET device. In contrast to the NFET region, these trenches are filled with SiGe material 34, which is grown epitaxially. The longitudinal dimensions of these elements are smaller to those described above for the NFET region. The PFET gate island formed by layers 16 and 18 has a resulting size of 200 Å to 400 Å, resulting in a preferred halfwidth of 150 Å. The SiGe material 34 induces a compressive stress on the Si channel of the PFET device, resulting in improved PFET device characteristics.

Figure 1H:
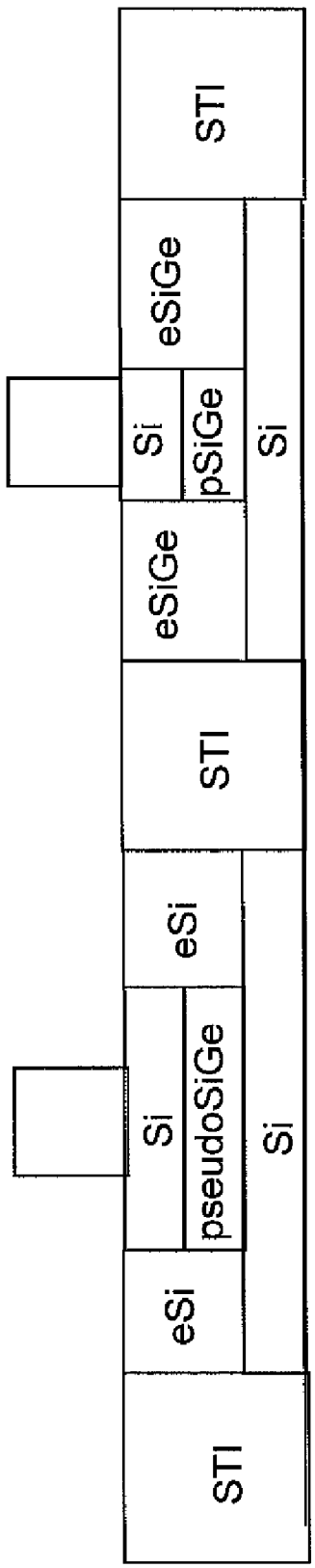

FIG. 1h shows the fabricated CMOS device disposed of the sacrificial material. The ratio of the eSiGe material 34 can vary between any germanium above 0% with respect to the total amount of silicon and germanium in the trench.

FIG. 2a illustrates the locations of the stresses in an NFET device according to the invention. As shown in FIG. 2a, tensile stresses are present in the channel of the NFET. More specifically, in the structure of the invention, the lattice structure of the SiGe layer 16 matches the lattice structure of the underlying Si layer 14. This results in the SiGe layer 16 and the surrounding areas being under a compressive stress. Upon etching the S/D trenches, the edges of the SiGe layer will undergo elastic relaxation, resulting in a tensile stress of the Si layer 18 in the channel.

FIG. 2b illustrates the course of stress as a function of longitudinal distance to the center of the gate of the NFET device. For a Ge content of 20% and a thickness of Si layer 18 of about 200 Å, the current invention provides tensile stresses in the range of about 300 MPa. In implementations, the preferred range of the longitudinal stress component (stress in direction of current flow from source to drain) in the Si layer 18, is preferred to be greater than 100 MPa. FIG. 2b also shows that the tensile stresses extent laterally into the epitaxially grown Si elements 32 and tensile stresses above about 100 MPa reaches up to 150 Å into the Si element 32 and reaches relaxation at about 250 Å from the edge of the gate.

Figure 3:
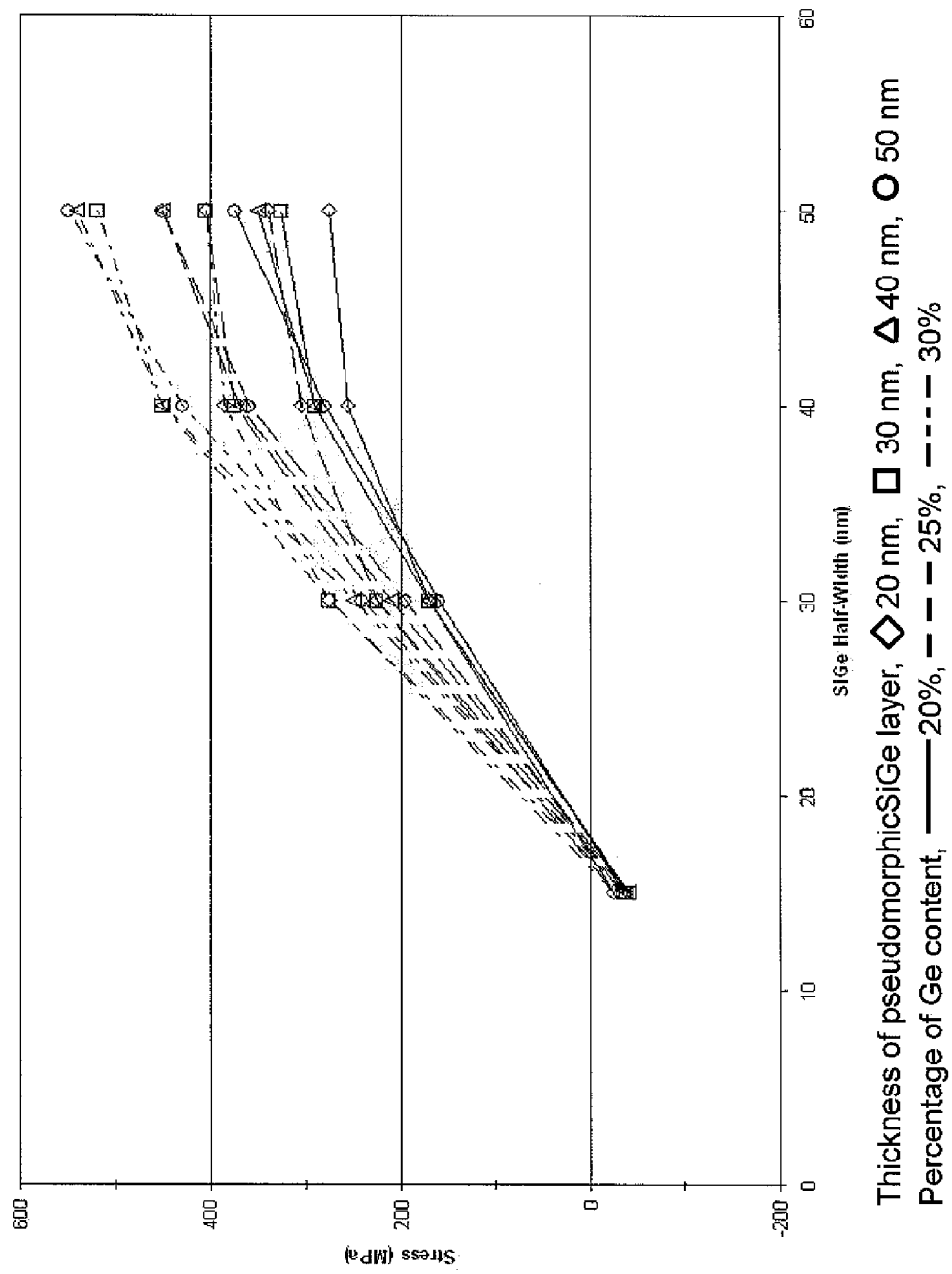
FIG. 3 illustrates and compares the Average Channel Stress as function of the Halfwidth of the gate for various pseudomorphic SiGe layer thicknesses and their varying Ge-content.

FIG. 3 show the course of stress as a function of the halfwidth with varying sizes of the thickness of SiGe layer 16 into the above lying silicon layers 18. As shown in this graph, the Ge content of the SiGe layer ranged from 20% to 30%. The halfwidth of the NFET ranges from about 150 Å to 500 Å. Interestingly, high stresses (above 200 MPa) can be triggered by varying the Ge content or the thickness of layer 16. For example at a NFET halfwidth of 300 Å and a PFET halfwidth of about 150 Å, stress above about 200 MPa can be reached by either a 25% Ge-content and a thickness of about 400 Å or a 30% Ge-content and a thickness of about 200 Å. Furthermore, changing the thickness or the Ge-content of layer 16 shows an hyperbolic course of stress with varying halfwidths, and gives in the current FIG. 3 a maximum at about 575 MPa, when the thickest and most concentrated layer 16 is measured at a halfwidth of about 500 Å

Thus, in the structure of the invention, tensile stresses are now formed in the channel of NFET and compressive stresses are formed in the PFET. By allowing such stresses, high device performance can be achieved. In addition, with the processes of the invention, the manufacturing costs can be reduced while resulting in higher yields.

While the invention has been described in terms of embodiments, those skilled in the art will recognize that the invention can be practiced with the modification within the spirit and scope of the appended claims. For example, the invention can be readily applicable to bulk substrates.

What is claimed is:

1. A method of manufacturing a semiconductor structure comprising:
   forming, simultaneously, a layered structure with an underlying stress inducing material in a p-type field-effect-transistor (PFET) channel region and a n-type field-effect-transistor (NFET) channel region, wherein the layered structure with the underlying stress inducing material comprises a top layer of Si of uniform thickness and the underlying layer of SiGe;
   forming on the top layer of Si of uniform thickness sidewall spacers of different sizes on NFET and PFET regions; and
   etching an island in the NFET channel region and the PFET channel region comprising a channel length corresponding to the different sizes of the sidewall spacers, wherein the channel length of the NFET creates a higher resultant stress component in the NFET channel region than the PFET channel region; and
   forming a stress inducing material in etched portions of the PFET channel region creating an opposite stress component in the PFET channel region than in the NFET channel region.

2. The method of claim 1, wherein the channel length is different in the NFET or PFET channel regions.

3. The method of claim 1, wherein the NFET channel region is longer than the PFET channel region.

4. The method of claim 2, wherein the NFET channel region has a gate island wider than the PFET channel region.

5. The method of claim 1, wherein a halfwidth of the NFET channel region is larger than a halfwidth of the PFET channel region.

6. The method of claim 5, wherein the germanium content of the SiGe is approximate from 20% and 30%.

7. The method of claim 5, wherein the halfwidth of the NFET channel region is approximately 400 Å to 500 Å.

8. The method of claim 5, wherein the halfwidth of the NFET channel region increases tensile stress in the NFET channel region.

9. The method of claim 8, wherein the stress inducing material in etched portions of the PFET channel region create compressive forces in the PFET channel region.

10. The method of claim 1, wherein the etching and forming steps of the PFET channel region are provided while the NFET channel region is protected.

* * * * *